(12) United States Patent
Giles et al.

(10) Patent No.: US 9,583,487 B2
(45) Date of Patent: Feb. 28, 2017

(54) SEMICONDUCTOR DEVICE HAVING METALLIC SOURCE AND DRAIN REGIONS

(75) Inventors: Martin D. Giles, Portland, OR (US); Annalisa Cappellani, Portland, OR (US); Sanaz Kabehie, Portland, OR (US); Rafael Rios, Portland, OR (US); Cory E. Weber, Hillsboro, OR (US); Aaron A. Budrevich, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 117 days.

(21) Appl. No.: 13/995,419

(22) PCT Filed: Dec. 19, 2011

(86) PCT No.: PCT/US2011/065931
§ 371 (c)(1),
(2), (4) Date: Jun. 18, 2013

(87) PCT Pub. No.: WO2013/095349
PCT Pub. Date: Jun. 27, 2013

(65) Prior Publication Data
US 2014/0035059 A1 Feb. 6, 2014

(51) Int. Cl.
*H01L 21/8238* (2006.01)
*H01L 29/66* (2006.01)
(Continued)

(52) U.S. Cl.
CPC .... *H01L 27/092* (2013.01); *H01L 21/823814* (2013.01); *H01L 27/088* (2013.01);
(Continued)

(58) Field of Classification Search
CPC .......... H01L 21/823814; H01L 27/092; H01L 29/66636; H01L 29/7839
See application file for complete search history.

(56) References Cited

U.S. PATENT DOCUMENTS 7,943,469 B2   5/2011   Cook, Jr. et al.
8,450,165 B2   5/2013   Bohr
(Continued)

OTHER PUBLICATIONS

International Preliminary Report on Patentability from PCT/US2011/065931 mailed Jul. 3, 2014, 7 pgs.
(Continued)

*Primary Examiner* — Kevin Parendo
(74) *Attorney, Agent, or Firm* — Blakely, Sokoloff, Taylor & Zafman LLP

(57) ABSTRACT

Semiconductor devices having metallic source and drain regions are described. For example, a semiconductor device includes a gate electrode stack disposed above a semiconducting channel region of a substrate. Metallic source and drain regions are disposed above the substrate, on either side of the semiconducting channel region. Each of the metallic source and drain regions has a profile. A first semiconducting out-diffusion region is disposed in the substrate, between the semiconducting channel region and the metallic source region, and conformal with the profile of the metallic source region. A second semiconducting out-diffusion region is disposed in the substrate, between the semiconducting channel region and the metallic drain region, and conformal with the profile of the metallic drain region.

23 Claims, 7 Drawing Sheets

(51) Int. Cl.
  *H01L 29/78* (2006.01)
  *H01L 27/092* (2006.01)
  *H01L 27/088* (2006.01)
  *H01L 29/06* (2006.01)

(52) U.S. Cl.
  CPC .. *H01L 29/66636* (2013.01); *H01L 29/66795* (2013.01); *H01L 29/785* (2013.01); *H01L 29/7839* (2013.01); *H01L 29/7845* (2013.01); *H01L 29/0673* (2013.01); *H01L 2924/0002* (2013.01)

(56) References Cited

U.S. PATENT DOCUMENTS

| | | | |
|---|---|---|---|
| 2005/0148137 A1 | 7/2005 | Brask et al. | |
| 2005/0280102 A1* | 12/2005 | Oh | H01L 29/0847 257/401 |
| 2006/0038229 A1* | 2/2006 | Tsuchiya et al. | 257/351 |
| 2007/0057347 A1* | 3/2007 | Ikeda | 257/616 |
| 2007/0190731 A1 | 8/2007 | Chen et al. | |
| 2008/0111163 A1 | 5/2008 | Russ et al. | |
| 2008/0124878 A1* | 5/2008 | Cook et al. | 438/300 |
| 2008/0283906 A1* | 11/2008 | Bohr | 257/327 |
| 2009/0174002 A1* | 7/2009 | Ouyang | H01L 21/823807 257/369 |
| 2009/0283824 A1* | 11/2009 | Knight et al. | 257/335 |
| 2010/0065887 A1* | 3/2010 | Goebel et al. | 257/192 |
| 2010/0163983 A1 | 7/2010 | Choi | |
| 2011/0121400 A1* | 5/2011 | Larrieu et al. | 257/369 |
| 2011/0298008 A1* | 12/2011 | Greene | H01L 21/3247 257/190 |

OTHER PUBLICATIONS

Office Action for Taiwan Patent Application No. 101146400, mailed Aug. 19, 2014, 7pgs.
International Search Report and Written Opinion for PCT Patent Application No. PCT/US2011/065931 Mailed Aug. 30, 2012, 10 Pages.
Office Action for Korean Patent Application No. 10-2014-7017386, mailed Feb. 24, 2016, 7 pgs.
Office Action and Search Report from Taiwan Patent Application No. 104141509, mailed Oct. 24, 2016, 14 pgs.

* cited by examiner

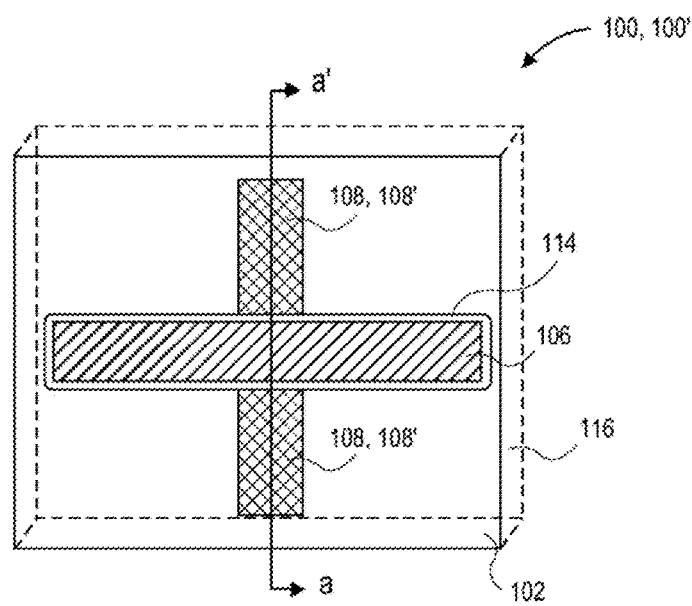
FIG. 1A
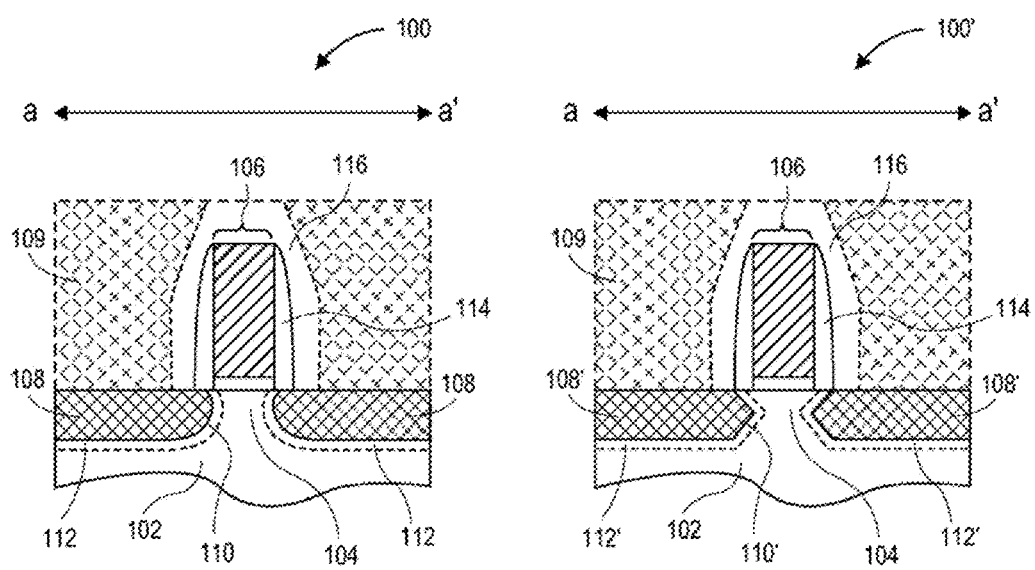
FIG. 1B  FIG. 1B'

SEMICONDUCTOR DEVICE HAVING METALLIC SOURCE AND DRAIN REGIONS

CLAIM OF PRIORITY

This application is a U.S. National Phase application under 35 U.S.C. §371 of International Application No. PCT/US2011/065931, filed Dec. 19, 2011, entitled "SEMICONDUCTOR DEVICE HAVING METALLIC SOURCE AND DRAIN REGIONS," the entire contents of which are incorporated herein by reference.

TECHNICAL FIELD

Embodiments of the invention are in the field of semiconductor devices and, in particular, semiconductor devices having metallic source and drain regions.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, leading to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the reduced leakage they can offer.

On bulk silicon substrates, the fabrication process for tri-gate transistors often encounters problems when aligning the bottom of the metal gate electrode with the source and drain extension tips at the bottom of the transistor body (i.e., the "fin"). When the tri-gate transistor is formed on a bulk substrate, proper alignment is needed for optimal gate control and to reduce short-channel effects. For instance, if the source and drain extension tips are deeper than the metal gate electrode, punch-through may occur. Alternately, if the metal gate electrode is deeper than the source and drain extension tips, the result may be an unwanted gate capacitance parasitics.

Many different techniques have been attempted to improve external resistance ($R_{ext}$) of transistors including improved contact metals, increased activation of dopant and lowered barriers between the semiconductor and contact metal. However, significant improvements are still needed in the area of $R_{ext}$ reduction.

SUMMARY

Embodiments of the present invention include semiconductor devices having metallic source and drain regions.

In an embodiment, a semiconductor device includes a gate electrode stack disposed above a semiconducting channel region of a substrate. Metallic source and drain regions are disposed above the substrate, on either side of the semiconducting channel region. Each of the metallic source and drain regions has a profile. A first semiconducting out-diffusion region is disposed in the substrate, between the semiconducting channel region and the metallic source region, and conformal with the profile of the metallic source region. A second semiconducting out-diffusion region is disposed in the substrate, between the semiconducting channel region and the metallic drain region, and conformal with the profile of the metallic drain region.

In another embodiment, a semiconductor structure includes an N-type semiconductor device. The N-type semiconductor device includes an N-type gate electrode stack disposed above a first semiconducting channel region of a substrate. First metallic source and drain regions are disposed above the substrate, on either side of the first semiconducting channel region. Each of the first metallic source and drain regions has a first profile. A first pair of semiconducting out-diffusion regions is disposed in the substrate, between the first semiconducting channel region and a corresponding one of the first metallic source and drain regions, and conformal with the corresponding first profile. The semiconductor structure also includes a P-type semiconductor device. The P-type semiconductor device includes a P-type gate electrode stack disposed above a second semiconducting channel region of the substrate. Second metallic source and drain regions are disposed above the substrate, on either side of the second semiconducting channel region. Each of the second metallic source and drain regions has a second profile. A second pair of semiconducting out-diffusion regions is disposed in the substrate, between the second semiconducting channel region and a corresponding one of the second metallic source and drain regions, and conformal with the corresponding second profile.

In another embodiment, a method of fabricating a semiconductor device includes forming a gate electrode stack above a semiconducting channel region of a substrate. A pair of portions of the substrate is removed on either side of the semiconducting channel region. Subsequently, a pair of semiconducting regions is formed on either side of the semiconducting channel region. Subsequently, the pair of semiconducting regions is removed. Subsequently, metallic source and drain regions are formed on either side of the semiconducting channel region.

BRIEF DESCRIPTION OF THE DRAWINGS

FIG. 1A illustrates a top-down view of a semiconductor device 100 or 100', in accordance with an embodiment of the present invention.

FIG. 1B illustrates a cross-sectional view of the semiconductor device 100 of FIG. 1A, as taken along the a-a' axis, in accordance with an embodiment of the present invention.

FIG. 1B' illustrates a cross-sectional view of the semiconductor device 100' of FIG. 1A, as taken along the a-a' axis, in accordance with an embodiment of the present invention.

DETAILED DESCRIPTION

Figure 2A:
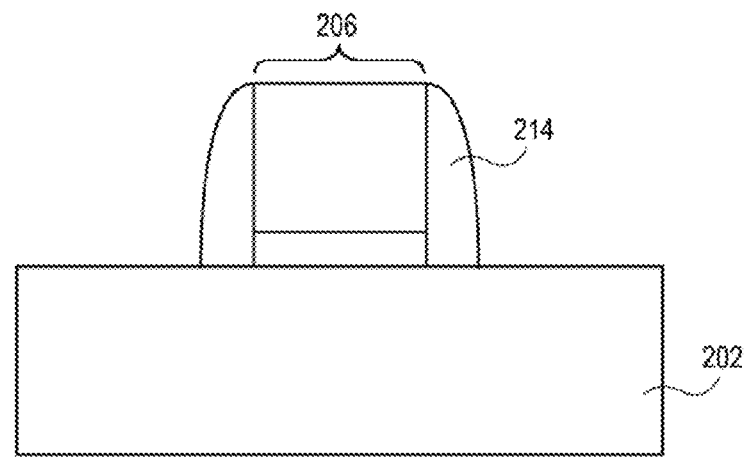
FIG. 2A illustrates a cross-sectional view representing a gate electrode stack formed above a semiconducting channel region of a substrate, in accordance with an embodiment of the present invention.

Semiconductor devices having metallic source and drain regions are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are targeted at self-aligned metal source/drain transistor fabrication. For example, metal source/drain/tip regions may be integrated with a conventional planar or tri-gate device. The metal regions may replace the conventional semiconductor source and drain regions usually implemented, and may be self-aligned to a gate electrode stack. Embodiments described herein may also find application with nanowire and nanoribbon devices.

In an embodiment, sacrificial source/drain/tip regions are formed using an undercut etch followed by silicon germanium epitaxy. In one such embodiment, out-diffusion of dopant impurity atoms from the silicon germanium may be performed to provide a thin, highly doped, conformal junction around the epitaxial regions. In an embodiment, following a selective removal of the epitaxial regions, metallic source and drain regions are formed. The material of the metallic source and drain regions is, in an embodiment, selected to induce an appropriate channel stress for an ultimately formed semiconductor device.

In an embodiment, drive current of a semiconductor device is improved by decreasing the series resistance of the source and drain regions, e.g., with metallic source and drain regions. One or more embodiments enable new device options combining mid-gap metallization with undoped channels. In an embodiment, metal source/drain/tip regions are formed as opposed to conventional devices using highly doped semiconducting regions (e.g., silicon or silicon germanium).

One or more embodiments involve the replacement of doped semiconducting regions with metallic regions, such as pure metal or metal alloy regions. In an embodiment, series resistance is lowered when such metallic regions are used in conjunction with a contact scheme with low interface barrier height. The contact metal may be chosen to provide a different work-function from that of doped silicon or silicon germanium, allowing a low resistance mid-gap contact to be formed. The fill metal and process may be selected to act as a stressor for a corresponding channel region. This approach may provide a particular advantage for NMOS devices where a decent epitaxial semiconductor stressor is typically not available. In an embodiment, metal source/drains self-aligned with the channel are formed, and a conformal out-diffusion doping region is optionally provided. The parasitic resistance of tri-gate and fin-FET type devices may be reduced by using approaches described herein.

FIG. 1A illustrates a top-down view of a semiconductor device 100 or 100', in accordance with an embodiment of the present invention. FIG. 1B illustrates a cross-sectional view of the semiconductor device 100 of FIG. 1A, as taken along the a-a' axis. FIG. 1B' illustrates a cross-sectional view of the semiconductor device 100' of FIG. 1A, as taken along the a-a' axis.

Referring to FIGS. 1A and 1B or 1B', the semiconductor device 100 or 100' includes a gate electrode stack 106 disposed above a semiconducting channel region 104 of a substrate 102. Metallic source and drain regions 108 or 108' are disposed above the substrate 102, on either side of the semiconducting channel region 104. Both of the metallic source and drain regions (pairs 108 or 108') have a profile 110 or 110', respectively. A pair of semiconducting out-diffusion regions 112 or 112' is disposed in the substrate 102, between the semiconducting channel region 104 and the metallic source and drain regions (pairs 108 or 108').

In an embodiment, the pair of semiconducting out-diffusion regions 112 or 112' is conformal with the profile of the metallic source and drain regions 108 or 108'. For example, referring to FIG. 1B, in one embodiment, the metallic source and drain regions 108 have rounded profiles 110. The pair of semiconducting out-diffusion regions 112 is conformal with the rounded profiles 110. In another example, referring to FIG. 1B', in one embodiment, the metallic source and drain regions 108' have faceted profiles 110'. The pair of semiconducting out-diffusion regions 112' is conformal with the faceted profiles 110'.

In an embodiment, the gate electrode stack 106 further includes sidewall spacers 114. In one such embodiment, at least a portion of each of the metallic source and drain regions (pairs 108 or 108') is disposed under a sidewall spacer 114 of the gate electrode stack 106. Furthermore, the pair of semiconducting out-diffusion regions 112 or 112' may also be partially or completely disposed underneath the sidewall spacers 114, and possibly underneath a portion of the gate electrode stack 106.

In an embodiment, the metallic source and drain regions (of pairs 108 or 108') are each included in a corresponding continuous contact structure disposed in a dielectric layer 116 disposed above the substrate 102. For example, as shown in FIGS. 1B and 1B', the metallic source and drain regions of pairs 108 or 108' have extensions 109 that effectively act as contacts to devices 100 or 100', respectively. In one such embodiment, the extensions and the metallic source and drain regions are continuous structures formed at the same time, as described in greater detail below.

Semiconductor device 100 or 100' may be any semiconductor device incorporating a gate, a channel region and a pair of source/drain regions. In an embodiment, semiconductor device 100 or 100' is one such as, but not limited to, a MOS-FET or a Microelectromechanical System (MEMS). In one embodiment, semiconductor device 100 or 100' is a planar or three-dimensional MOS-FET and is an isolated device or is one device in a plurality of nested devices. As will be appreciated for a typical integrated circuit, both N- and P-channel transistors may be fabricated on a single substrate to form a CMOS integrated circuit, a semiconductor structure which is described in greater detail below.

Substrate 102 and, hence, channel region 104 may be composed of a semiconductor material that can withstand a manufacturing process and in which charge can migrate. In an embodiment, the substrate 102 is a bulk substrate, and the semiconducting channel region 104 is continuous with the bulk substrate 102. In an embodiment, substrate 102 is composed of a crystalline silicon, silicon/germanium or germanium layer doped with a charge carrier, such as but not limited to phosphorus, arsenic, boron or a combination thereof. In one embodiment, the concentration of silicon atoms in substrate 102 is greater than 97% or, alternatively, the concentration of dopant atoms is less than 1%. In another embodiment, substrate 102 is composed of an epitaxial layer grown atop a distinct crystalline substrate, e.g. a silicon epitaxial layer grown atop a boron-doped bulk silicon monocrystalline substrate. Substrate 102 may also include an insulating layer disposed in between a bulk crystal substrate and an epitaxial layer to form, for example, a silicon-on-insulator substrate. In such an example, the semiconducting channel region 104 may be an isolated channel region. In an embodiment, the insulating layer is composed of a material such as, but not limited to, silicon dioxide, silicon nitride, silicon oxy-nitride or a high-k dielectric layer. Substrate 102 may alternatively be composed of a group III-V material. In an embodiment, substrate 102 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. Channel region 104 may be composed of multiple semiconductor materials, each of which may include additional doping atoms. In one embodiment, substrate 102 is composed of crystalline silicon and the charge-carrier dopant impurity atoms are one such as, but not limited to, boron, arsenic, indium or phosphorus. In another embodiment, substrate 102 is composed of a III-V material and the charge-carrier dopant impurity atoms are ones such as, but not limited to, carbon, silicon, germanium, oxygen, sulfur, selenium or tellurium. In another embodiment, the channel region 104 is undoped or only lightly doped. Additionally, halo doping, often used in conventional device fabrication, may in one embodiment be eliminated in the fabrication of semiconductor device 100 or 100'. It is to be understood that, in an embodiment, the material of the channel 104 is different from the material of the substrate 102.

In an embodiment, the semiconductor device 100 or 100' is a planar device and the gate electrode stack 106 is disposed on only a single surface of the semiconducting channel region 104. In another embodiment, however, the semiconductor device 100 or 100' is a non-planar device such as, but not limited to, a fin-FET or a tri-gate device. In such an embodiment, the semiconducting channel region 104 is composed of or is formed in a three-dimensional body. In one such embodiment, the gate electrode stack 106 surrounds at least a top surface and a pair of sidewalls of the three-dimensional body. In another embodiment, the semiconducting channel region 104 is made to be a discrete three-dimensional body, such as in a nanowire device. In one such embodiment, the gate electrode stack 106 completely surrounds the semiconducting channel region 104.

In the case of a three-dimensional body for a semiconducting channel region 104, whether discrete or non-discrete, the semiconducting channel region 104 may be fabricated from a bulk substrate, with the semiconducting channel region 104 continuous with the bulk substrate. Alternatively, the semiconducting channel region 104 may be fabricated from a starting semiconductor-on-insulator substrate. In another embodiment, the semiconducting channel region 104 is formed directly from a bulk substrate and local oxidation is used to form electrically insulative underlying regions. In another alternative embodiment, the structure 100 is formed directly from a bulk substrate and doping is used to form electrically isolated active regions. In one such embodiment, the an omega-FET type structure is formed. In an embodiment, in the case of nanowires, the semiconducting channel region 104 may be sized as a wire or a ribbon, and may have squared-off or rounder corners.

Gate electrode stack 106 may include a gate electrode and an underlying gate dielectric layer. In an embodiment, the gate electrode of gate electrode stack 106 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the semiconducting channel region 104. In an embodiment, the gate dielectric layer is comprised of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In an embodiment, the gate electrode is composed of a P-type material. In another embodiment, the gate electrode is composed of an N-type material. In another embodiment, the gate electrode is composed of a mid-gap material. In a specific such embodiment, the corresponding channel region is undoped or is only lightly doped.

In accordance with an embodiment of the present invention, the source and drains (either pair 108 or 108') is described as "conducting." The term metallic is distinguished from semiconducting, e.g., as is otherwise used for the channel region and the out-diffusion regions. Metallic source and drain regions are those composed of materials that are metallic as opposed to doped semiconductor materials. Thus, in an embodiment, metallic source and drain regions 108 or 108' are composed of a metallic species, as opposed to a doped semiconductor material which is understood to be semiconducting. In an example, source and drains regions 108 or 108' (and, if applicable, extension or contact region 109) are composed of a conductive material such as, but not limited to a metal nitride, a metal carbide, a metal silicide, a metal aluminide, hafnium, zirconium, titanium, tantalum, aluminum, ruthenium, palladium, platinum, cobalt, nickel or a conductive metal oxide, e.g. ruthenium oxide. In one such embodiment, the metallic source and drain regions 108 or 108' are composed of an N-type conductive material such as, but not limited to a metal carbide or a metal aluminide. In another such embodiment, the metallic source and drain regions 108 or 108' are composed of a P-type conductive material such as, but not limited to a metal carbide or a metal aluminide. The metallic source and drain regions 108 or 108' may be composed of a single material, such as a single metal species or alloy species. Alternatively, a thin conducive liner film, such as titanium nitride or tantalum nitride may first be formed followed by a fill material such as a single metal species or alloy species.

Thus, in an embodiment, the metallic source and drain regions 108 or 108' are fabricated from a metal species. The metal species may be a pure metal, such as nickel or cobalt, or may be an alloy such as a metal-metal alloy or a metal-semiconductor alloy (e.g., such as a silicide material). However, the metallic source and drain regions 108 or 108' are to be distinguished from a source and drain region formed in a silicide process where a top portion of a silicon source and drain region is consumed by a metal to form an overlying silicide material atop a semiconducting remainder source and drain region. That is, although a silicide material is listed as a possibility for the entirety of source and drain regions 108 or 108', in an embodiment, such a silicide is deposited as an already formed silicide metallic material, as opposed to being formed via consumption of a portion of a silicon source/drain region. Such consumption may otherwise lead to structure roughness and loss of tolerance control.

In an embodiment, the metallic source and drain regions 108 or 108' uniaxially stress the semiconducting channel region 104. In an example, the metallic source and drain regions 108 or 108' are formed at an elevated temperature and provide tensile uniaxial strain to semiconducting channel region 104 upon cooling following fabrication thereof. In an alternative embodiment, however, the metallic source and drain regions 108 or 108' provide compressive uniaxial strain to semiconducting channel region 104 following fabrication thereof.

Profiles 110 may be formed by, and hence dictated by, first forming etch-out regions in substrate 102. The etch-out regions may be formed by a technique suitable to selectively remove a portion of substrate 102 and to undercut gate electrode stack 106 and/or spacers 114. In one embodiment, the etch-out regions are formed by etching exposed portions of substrate 102 with a dry etch process, a wet etch process or a combination thereof. In one embodiment, the etch-out regions are formed by a dry plasma etch using a plasma generated from a gas such as, but not limited to, $NF_3$ or $SF_6$ to form isotropic etch-out regions with rounded corners, as depicted for profiles 110 in FIG. 1B. In an alternative embodiment, etch-out regions are formed by a wet etch using $NH_4OH$ or tetramethylammonium hydroxide. The wet etch may be anisotropic in that the etch rate is significantly slow in directions of high crystal density. For example, in a specific embodiment, the wet etch is hindered by <111> crystal planes in a (100) silicon substrate to provide etch-out regions having a faceted profile, as depicted for profiles 110' in FIG. 1B'. The extent of undercut underneath gate electrode stack 106 may be increased by first carrying out a brief dry etch followed by an anisotropic wet etch process.

In an embodiment, the semiconductor device 100 or 100' is an N-type device, the semiconducting channel region 104 is composed of silicon, and the pair of semiconducting out-diffusion regions 112 or 112' are formed from dopant impurity atoms such as, but not limited to, phosphorous or arsenic. In another embodiment, the semiconductor device 100 or 100' is a P-type device, the semiconducting channel region 104 is composed of silicon, and the pair or semiconducting out-diffusion regions 112 or 112' are formed from boron dopant impurity atoms.

In an embodiment, the sidewall spacers 114 are composed of an insulative dielectric material such as, but not limited to, silicon dioxide, silicon carbide, silicon oxy-nitride or silicon nitride. Likewise, the dielectric layer 116 may be composed of an insulative dielectric material such as, but not limited to, silicon dioxide, silicon carbide, silicon oxy-nitride or silicon nitride. Such a dielectric layer 116 may, in some contexts, be referred to as an inter-layer dielectric layer or an ILD0 layer.

As mentioned briefly above, a CMOS structure may be formed. More specifically, both N-type and P-type devices may be formed on the same substrate. In an exemplary embodiment of the present invention, with semiconductor device 100 or 100' illustrating one of the pair of devices, a semiconductor structure includes an N-type semiconductor device. The N-type semiconductor device includes an N-type gate electrode stack disposed above a first semiconducting channel region of a substrate. First metallic source and drain regions are disposed above the substrate, on either side of the first semiconducting channel region. Each of the first metallic source and drain regions has a first profile. A first pair of semiconducting out-diffusion regions is disposed in the substrate, between the first semiconducting channel region and a corresponding one of the first metallic source and drain regions. The first pair of semiconducting out-diffusion regions is conformal with the corresponding first profile.

The semiconductor structure also includes a P-type semiconductor device. The P-type semiconductor device includes a P-type gate electrode stack disposed above a second semiconducting channel region of the substrate. Second metallic source and drain regions are disposed above the substrate, on either side of the second semiconducting channel region. Each of the second metallic source and drain regions has a second profile. A second pair of semiconducting out-diffusion regions is disposed in the substrate, between the second semiconducting channel region and a corresponding one of the second metallic source and drain regions. The second pair of semiconducting out-diffusion regions is conformal with the corresponding second profile.

In an embodiment, one of the first or second metallic source and drain region pairs has rounded profiles, and the corresponding first or second pairs of semiconducting out-diffusion regions is conformal with the rounded profiles. In another embodiment, one of the first or second metallic source and drain region pairs has faceted profiles, and the corresponding first or second pairs of semiconducting out-diffusion regions is conformal with the faceted profiles. In an embodiment, one of the N-type of P-type gate electrode stacks includes sidewall spacers, and at least a portion of each of the corresponding first or second metallic source and drain region pairs is disposed under a sidewall spacer of the N-type of P-type gate electrode stack. In an embodiment, the first or second metallic source and drain region pairs is included in a pair of continuous contact structures disposed in a dielectric layer disposed above the substrate. In an embodiment, the first metallic source and drain regions uniaxially stress the first semiconducting channel region, and the second metallic source and drain regions uniaxially stress the second semiconducting channel region.

In an embodiment, the first semiconducting channel region is composed of silicon, and the first pair of semiconducting out-diffusion regions is formed from phosphorous or arsenic, or both, dopant impurity atoms. In that embodiment, the second semiconducting channel region is also composed of silicon, and the second pair of semiconducting out-diffusion regions is formed from boron dopant impurity atoms. In one such embodiment, the first metallic source and drain regions are composed of an N-type conductive material such as, but not limited to, a metal carbide or a metal aluminide, and the second metallic source and drain regions are composed of a P-type conductive material such as, but not limited to, a metal nitride, a metal carbide, or a metal silicide.

In an embodiment, the substrate is a bulk substrate, and the first and second semiconducting channel regions are continuous with the bulk substrate. In another embodiment, the substrate includes an insulating layer, and the first and second semiconducting channel regions are isolated channel regions. In an embodiment, the first and second semiconducting channel regions each include or are formed in a three-dimensional body, and the corresponding gate electrode stack surrounds at least a top surface and a pair of sidewalls of the three-dimensional body.

In another aspect, methods of fabricating a semiconductor device having conductive source and drain regions are provided. For example, FIGS. 2A-2F illustrate cross-sectional views representing various operations in a method of fabricating a semiconductor device, in accordance with an embodiment of the present invention.

Referring to FIG. 2A, a method of fabricating a semiconductor device includes forming a gate electrode stack 206 above a semiconducting channel region of a substrate 202. Spacers 214 may be formed along the sidewalls of gate electrode stack 206, as depicted in FIG. 2A. The gate electrode stack 206, the substrate 202 and corresponding channel region, and the spacers 214 may be composed of materials and have arrangements the same as or similar to the gate electrode stack 106, the substrate 102 and corresponding channel region 104, and the spacers 114, described above. In an embodiment, the gate electrode stack 206 is an already formed permanent gate dielectric layer and gate electrode pair. In another embodiment, however, the gate electrode stack 206 is a placeholder stack or single layer for ultimate use in a subsequent replacement gate or gate-last processing scheme.

Although not depicted, in an optional embodiment, a pair of tip extensions may be formed at this stage by implanting charge-carrier dopant impurity atoms into substrate 202. In such a case, gate electrode stack 206 may act to mask a portion of substrate 202 to form self-aligned tip extensions. In one embodiment, boron, arsenic, phosphorus, indium or a combination thereof is implanted into substrate 202 to form such tip extensions.

Figure 2B:
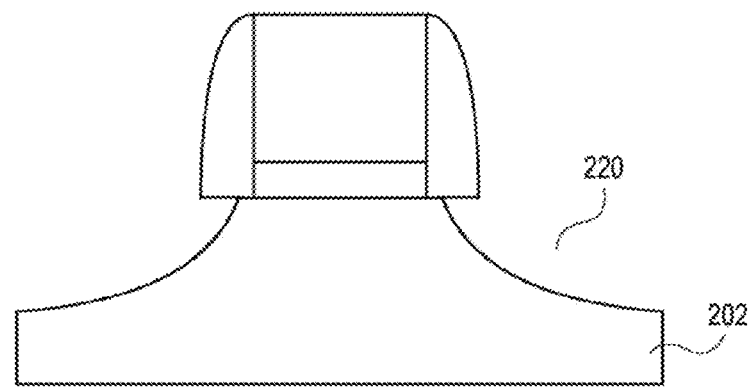
FIG. 2B illustrates a cross-sectional view representing removal of a pair of portions of the substrate of FIG. 2A to provide recessed regions on either side of a semiconducting channel region disposed in the substrate, underlying the gate electrode stack, in accordance with an embodiment of the present invention.

Referring to FIG. 2B, a pair of portions of the substrate 202 is removed to provide recessed regions 220, on either side of a semiconducting channel region disposed in substrate 202 underlying gate electrode stack 206. Recessed regions 220 may be formed by any suitable technique that removes a portion of substrate 202 without detrimentally impacting other semiconductor features that are present, such as a dry etch or a wet etch process. In one embodiment, recessed regions 220 are formed by a dry plasma etch using $NF_3$, HBr, $SF_6/Cl$ or $Cl_2$ or a wet etch using $NH_4OH$ or tetramethylammonium hydroxide. In one embodiment, gate electrode stack 206 guides the formation of recessed regions 220, forming self-aligned recessed regions 220. In one embodiment, recessed regions 220 are formed with rounded corners, as shown in FIG. 2B and described in association with FIG. 1B. In another embodiment, however, recessed regions 220 are formed with faceted corners, as described in association with FIG. 1B'.

Figure 2C:
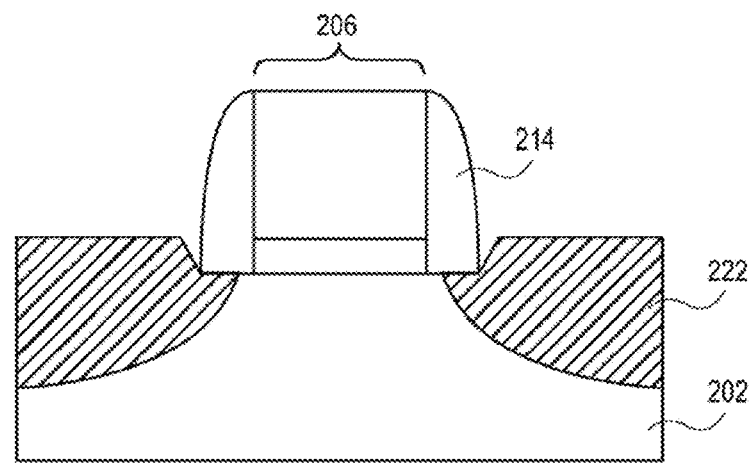
FIG. 2C illustrates a cross-sectional view representing formation of a pair of semiconducting regions in the recessed regions of FIG. 2B, in accordance with an embodiment of the present invention.
Figure 2D:
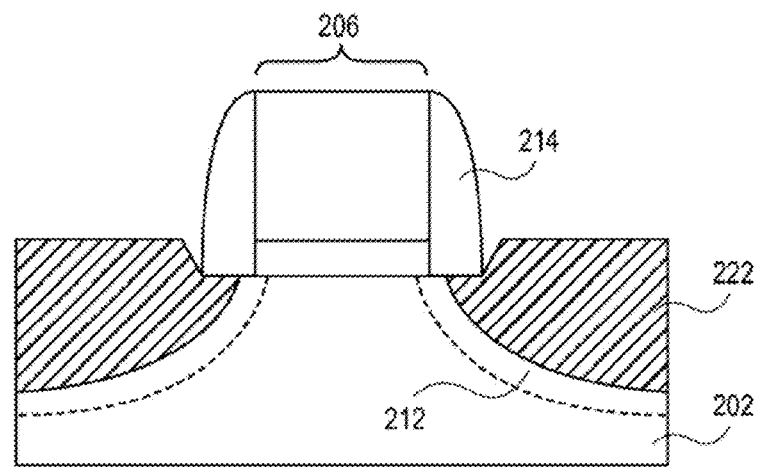
FIG. 2D illustrates a cross-sectional view representing formation of a pair of out-diffusion regions from the pair of semiconducting regions of FIG. 2C, in accordance with an embodiment of the present invention.

Referring to FIG. 2C, a pair of semiconducting regions 222 is formed in the recessed regions 220, e.g., epitaxially formed on either side of a semiconducting channel region formed in substrate 202. Referring to FIG. 2D, a pair of out-diffusion regions 212 is formed in the substrate 202, on either side of a semiconducting channel region disposed under gate electrode stack 206.

In accordance with an embodiment of the present invention, the pair of out-diffusion regions 212 is formed from the semiconducting regions 222 and is conformal with the semiconducting regions 222. In one such embodiment, the semiconductor device ultimately formed is an N-type semiconductor device. The semiconductor channel region is composed of silicon, and forming the pair of semiconducting regions 222 includes forming a pair of silicon germanium semiconducting regions. In a specific such embodiment, the pair of out-diffusion regions 212 is formed from phosphorous or arsenic dopant impurity atoms. In another such embodiment, the semiconductor device ultimately formed is a P-type semiconductor device. The semiconductor channel region is composed of silicon, and forming the pair of semiconducting regions 222 includes forming a pair of silicon/silicon germanium stack semiconducting regions. In a specific such embodiment, the pair of out-diffusion regions 212 is formed from boron dopant impurity atoms. The semiconducting region 222 may be grown with doping (in situ) or doping may be implanted to regions 222 after a growth process, or both.

In an embodiment, the material of the semiconducting regions 222 is selected to provide a conformal or essentially conformal out-diffusion region 212 based on diffusion rates of impurity atoms therein. For example, in an embodiment, silicon germanium is used as a semiconducting region 222 to form phosphorous or arsenic out-diffusion regions 212 in a silicon substrate. The phosphorous or arsenic diffuses faster in the silicon germanium than in the silicon, pushing the shaping of the corresponding out-diffusion region to be conformal to the silicon germanium semiconducting region 222. In another example, in an embodiment, silicon is used as a semiconducting region 222 to form boron out-diffusion regions 212 in a silicon substrate. The boron diffuses quickly in silicon, pushing the shaping of the corresponding out-diffusion region to be conformal to the silicon semiconducting region 222. However, a thin layer of silicon germanium may be used between the silicon substrate and the silicon semiconducting region 222 for subsequent use as an etch stop during removal of the silicon semiconducting region 222, as would be performed in association with FIG. 2E.

Figure 2E:
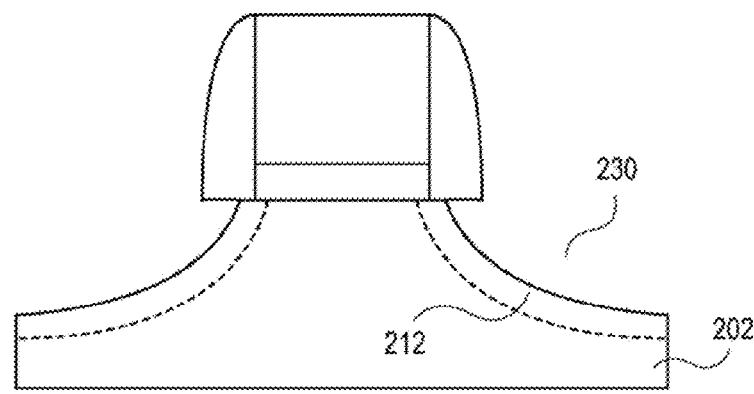
FIG. 2E illustrates a cross-sectional view representing removal of the pair of semiconducting regions of FIG. 2C to form second recessed regions, but retention of the out-diffusion regions of FIG. 2D, in accordance with an embodiment of the present invention.

Referring to FIG. 2E, the pair of semiconducting regions 222 is removed to provide recessed regions 230, but leaving out-diffusion regions 212 to remain in substrate 202. Thus, in an embodiment, the pair of semiconducting regions 222 is used as a sacrificial material to deliver dopant impurity atoms for out-diffusion formation. In one such embodiment, counter-intuitively, a sacrificial silicon germanium semiconducting region is used to provide phosphorous or arsenic dopant impurity atoms for an N-type device. In one such embodiment, the sacrificial silicon germanium semiconducting region uniaxially stress the semiconducting channel region with compressive stress, which would typically likely be undesirable for N-type devices. However, since the sacrificial silicon germanium semiconducting region is removed, the uniaxial compressive stress is alleviated prior to completion of device fabrication.

In an embodiment, silicon germanium semiconducting regions 222 are etched selectively with a wet etch that selectively removes the semiconducting regions 222 while not etching a silicon substrate 202. Such etch chemistries as carboxylic acid/nitric acid/HF chemistry, and citric acid/nitric acid/HF, for example, may be utilized to selectively etch the silicon germanium semiconducting regions 222. In the case of silicon removal, a thin layer of silicon germanium may be used as an etch stop layer, as mentioned above. Thus, in an embodiment, silicon semiconducting regions 222 are etched selectively to stop on a silicon germanium etch stop layer with a wet etch that selectively removes the silicon semiconducting regions 222 while not etching the silicon germanium etch stop layer. Such etch chemistries as aqueous hydroxide chemistries, including ammonium hydroxide and potassium hydroxide, for example, may be utilized to selectively etch the silicon semiconducting regions 222. The silicon germanium etch stop layer may then be removed by, e.g., carboxylic acid/nitric acid/HF chemistry or citric acid/nitric acid/HF.

Figure 2F:
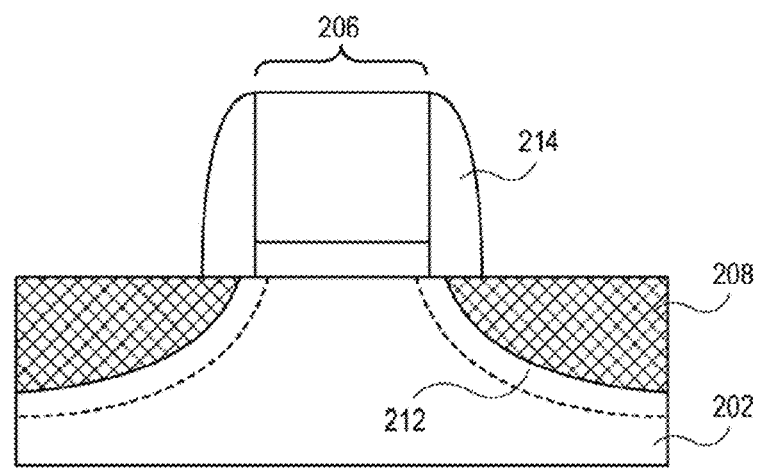
FIG. 2F illustrates a cross-sectional view representing a pair of metallic source and drain regions formed in the recessed regions of FIG. 2E, in accordance with an embodiment of the present invention.

Referring to FIG. 2F, a pair of metallic source and drain regions 208 is formed in the recessed regions 230, e.g., formed on either side of a semiconducting channel region formed in substrate 202. The pair of metallic source and drain regions 208 may be composed of materials and have arrangements the same as or similar to the pair of metallic source and drain regions 108, described above.

Although not shown in FIGS. 2E and 2F, but rather described in association with FIGS. 1B and 1B', prior to removing the semiconducting regions 222 and forming the pair of metallic source and drain regions 208, a dielectric layer such as dielectric layer 116 described above, may first be formed and patterned to expose the semiconducting regions 222 through contact holes. The semiconducting regions 222 are removed and the pair of metallic source and drain regions 208 are then formed through the contact holes. In fact, in a more elaborate embodiment, another sacrificial material may be used to replace semiconducting regions 222 and ultimately be removed through contact holes formed there above. In either case, both metallic source and drain formation, along with contact formation, is completed by depositing metal into the contact hole opening. In an embodiment, a multi-operation approach is used where a thin interface metal is conformally deposited using atomic layer deposition (ALD) and one or more contact fill metals is deposited to complete the contact formation, e.g., by using chemical vapor deposition (CVD), atomic layer deposition (ALD), or metal reflow. Other interface engineering approaches may be used to achieve the required interfacial contact resistance depending on the doping level on the silicon side of the interface. The fill metal and processing may be chosen to induce either tensile or compressive stress on the channel of the device to improve device performance. In an embodiment, the contact and source/drain fill is performed subsequent to a replacement gate process which may include, e.g., high temperature anneal of a high-k gate dielectric layer.

Figure 3A:
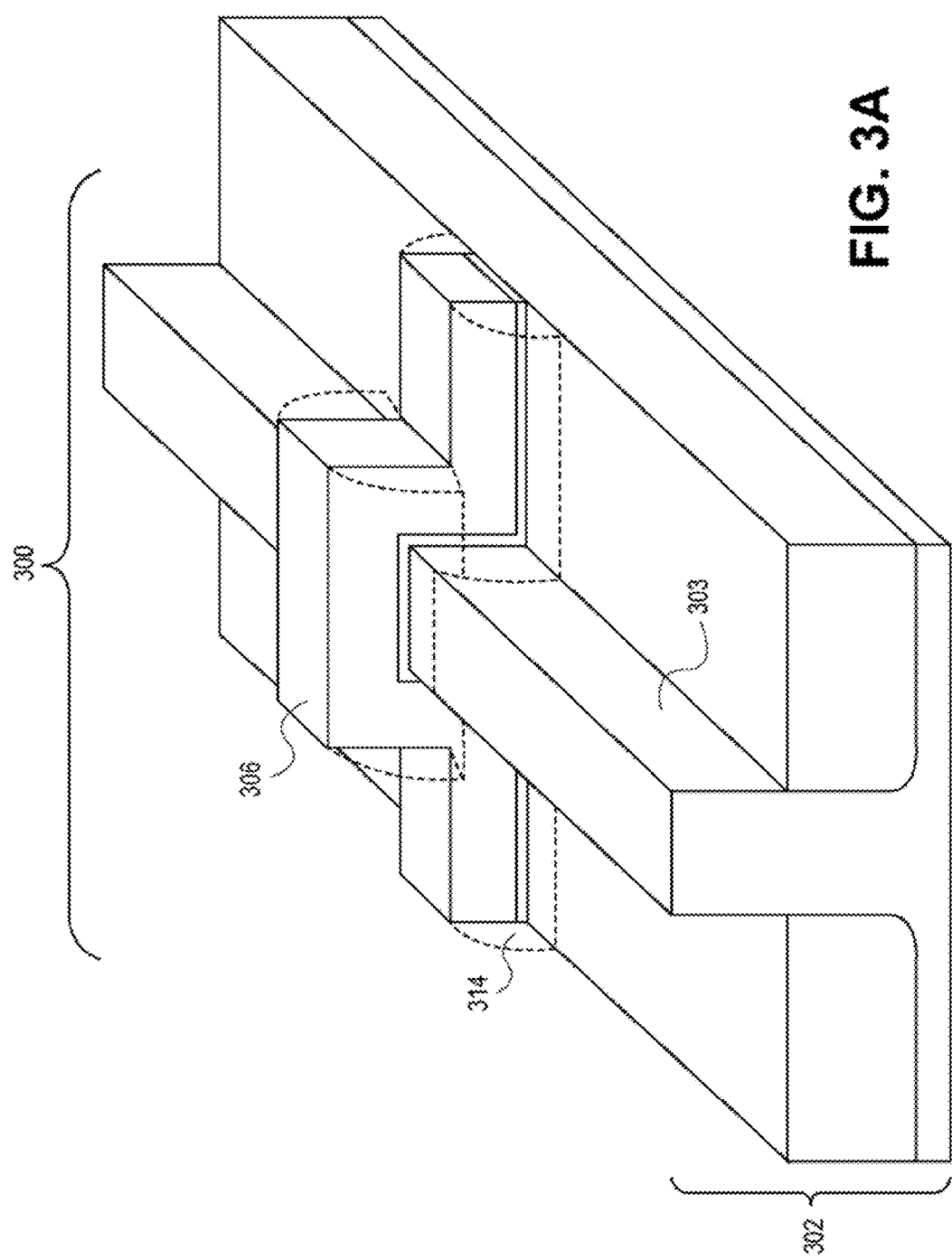
FIGS. 3A-3C illustrate angled views representing various operations in a method of fabricating a semiconductor device with a three-dimensional body, in accordance with an embodiment of the present invention.
Figure 3B:
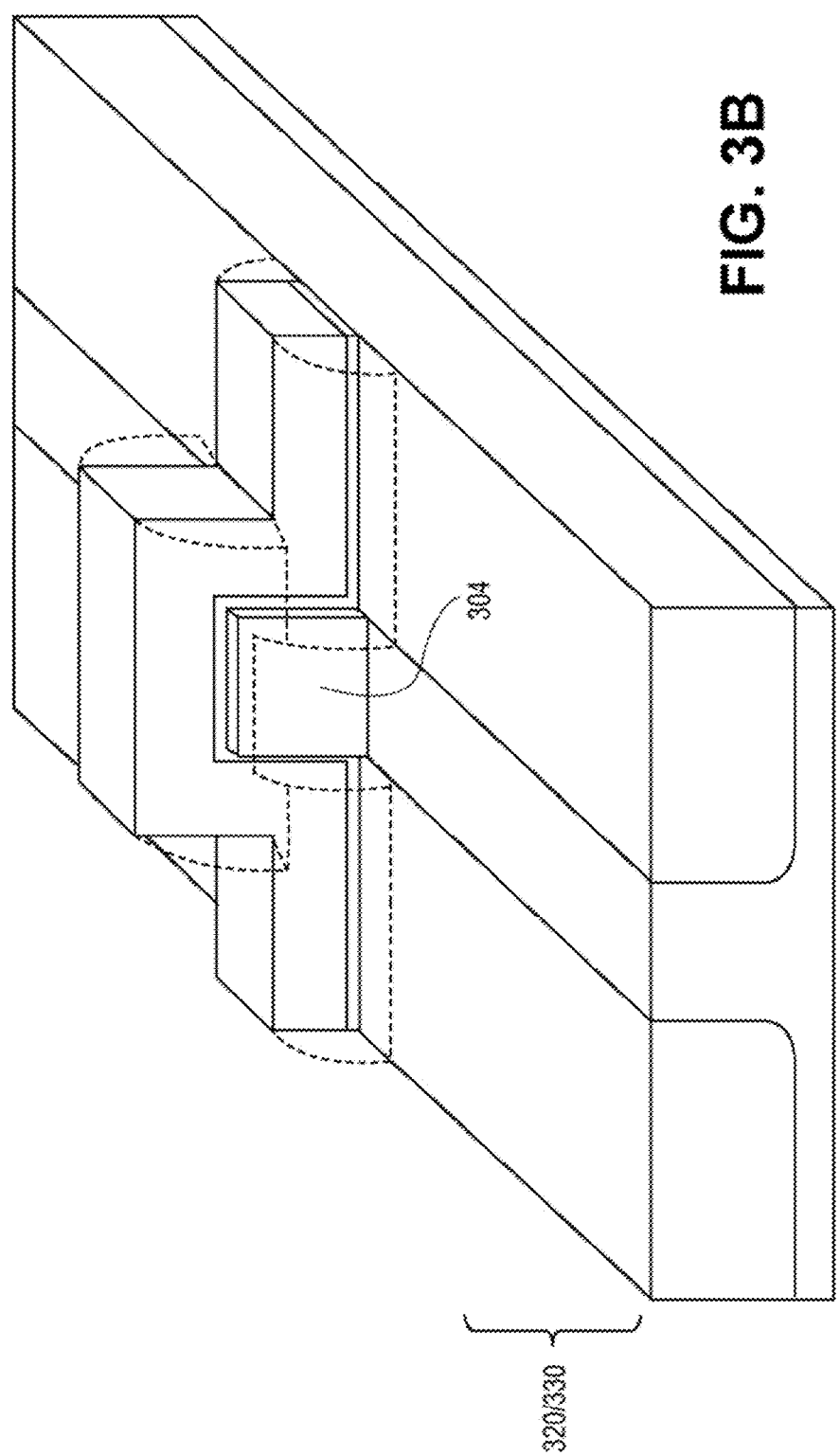
Figure 3C:
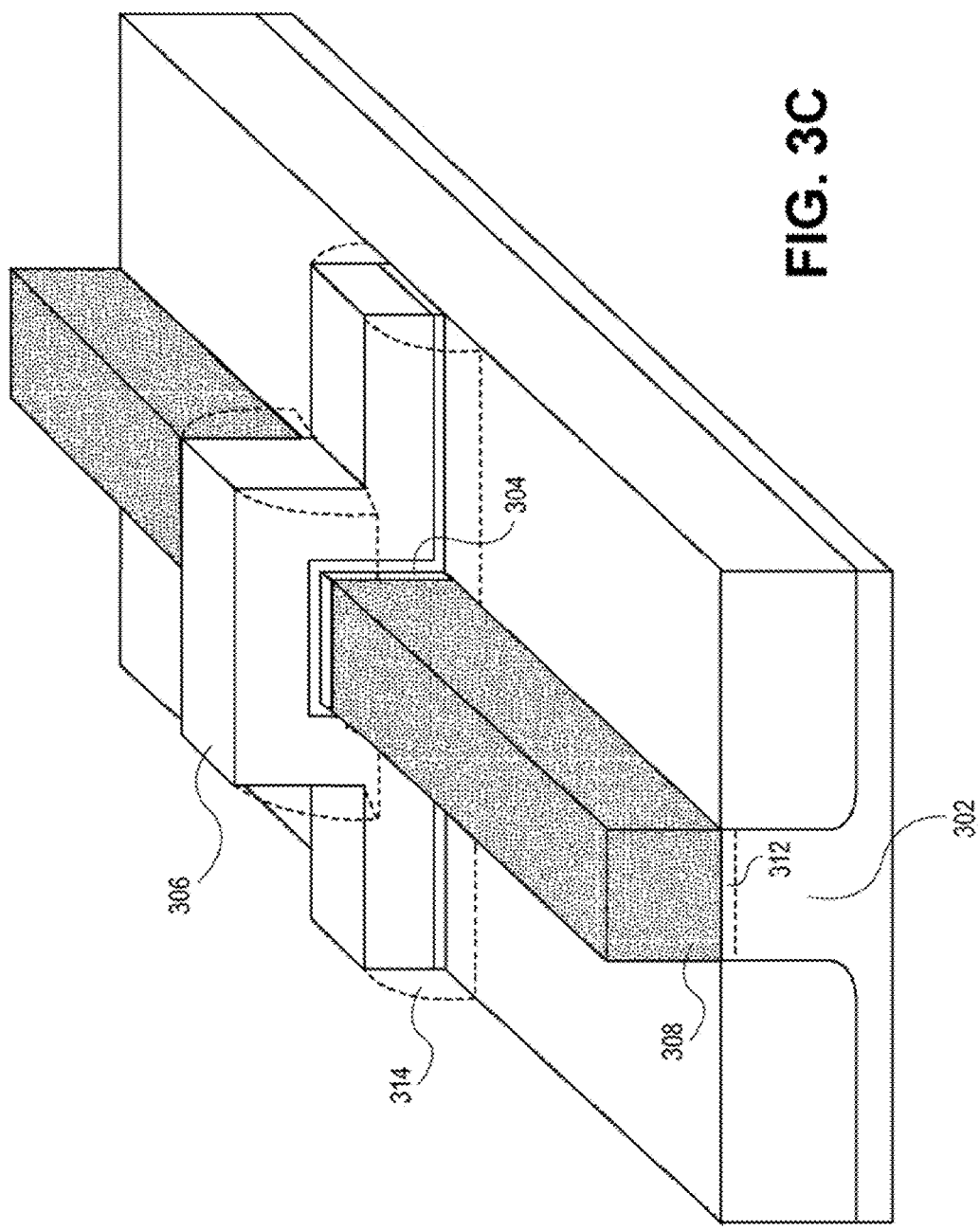

Embodiments of the present invention may be applied to non-planar MOS-FETs. For example, devices with a three-dimensional architecture, such as tri-gate devices, may benefit from the above described process. FIGS. 3A-3C illustrate angled views representing various operations in a method of fabricating a semiconductor device with a three-dimensional body, in accordance with an embodiment of the present invention.

Referring to FIG. 3A, the foundation of a bulk-substrate tri-gate MOS-FET 300 is formed. Tri-gate MOS-FET 300 includes a three-dimensional substrate 302 having a semi-conducting body 303. A gate electrode stack 306 is formed around the semiconducting body 303 to form a three-dimensional semiconducting channel region 304 (depicted in FIG. 3B). The gate electrode stack 306 is protected by a pair of gate isolation spacers 314.

Referring to FIG. 3B, portions of semiconducting body 303 are removed to form etch out regions 320, leaving three-dimensional channel region 304. Sacrificial semiconducting regions may then be formed in recessed region 320, used to deliver out-diffusion regions, and removed to form recessed regions 330, also depicted in FIG. 3B.

Referring to FIG. 3C, metallic source and drain regions 308 are formed in recessed regions 330. Also depicted are out-diffusion regions 312. Hence, a method to form a tri-gate MOS-FET device comprising metallic source/drain regions has been described. The tri-gate MOS-FET may be incorporated into an integrated circuit by conventional processing steps, as is known in the art.

Accordingly, one or more embodiments of the present invention involve the use of a portion of a conventional MOSFET process flow for a planar or tri-gate or fin-FET fabrication process. Optionally, to minimize any parasitic capacitance between the formed metallic source/drain regions and the gate in a tri-gate or fin-FET device, the fin spacer dielectric can be left in place to limit subsequent lateral epitaxial growth. For both NMOS and PMOS device types, in an embodiment, an undercut etch is used to remove silicon from the source/drain/tip regions, and silicon germanium is grown epitaxially in the source/drain opening. To minimize the final parasitic capacitance between the source/drain regions and the gate in a tri-gate or fin-FET device, less silicon germanium epitaxial growth may be used than is typically performed in a conventional PMOS flow. For example, it may be sufficient for the silicon germanium to fill up only the original fin region.

Optionally, in an embodiment, if conformal doping around a contact is required, the silicon germanium epitaxial film may be grown with doping or the film may be implanted with dopant after epitaxy. The device is then annealed to drive doping into the silicon to form a thin, conformal, highly doped region (out-diffusion region). For example, for an NMOS device, arsenic doping may be used. Since the diffusivity of arsenic in silicon germanium is very high, it will rapidly redistribute in silicon germanium and out-diffuse uniformly into the surrounding silicon.

Thus, embodiments of the present invention include methods to fabricate semiconductor devices with metallic source and drain regions. Structures formed from such methods may provide $R_{ext}$ improvements (reduction) versus conventional structures. Experimental results have shown that out-diffusion doping from sacrificial source and drain regions remains after removal of the sacrificial source and drain regions. The out-diffusion regions may aid in further alleviating $R_{ext}$ issues.

Figure 4:
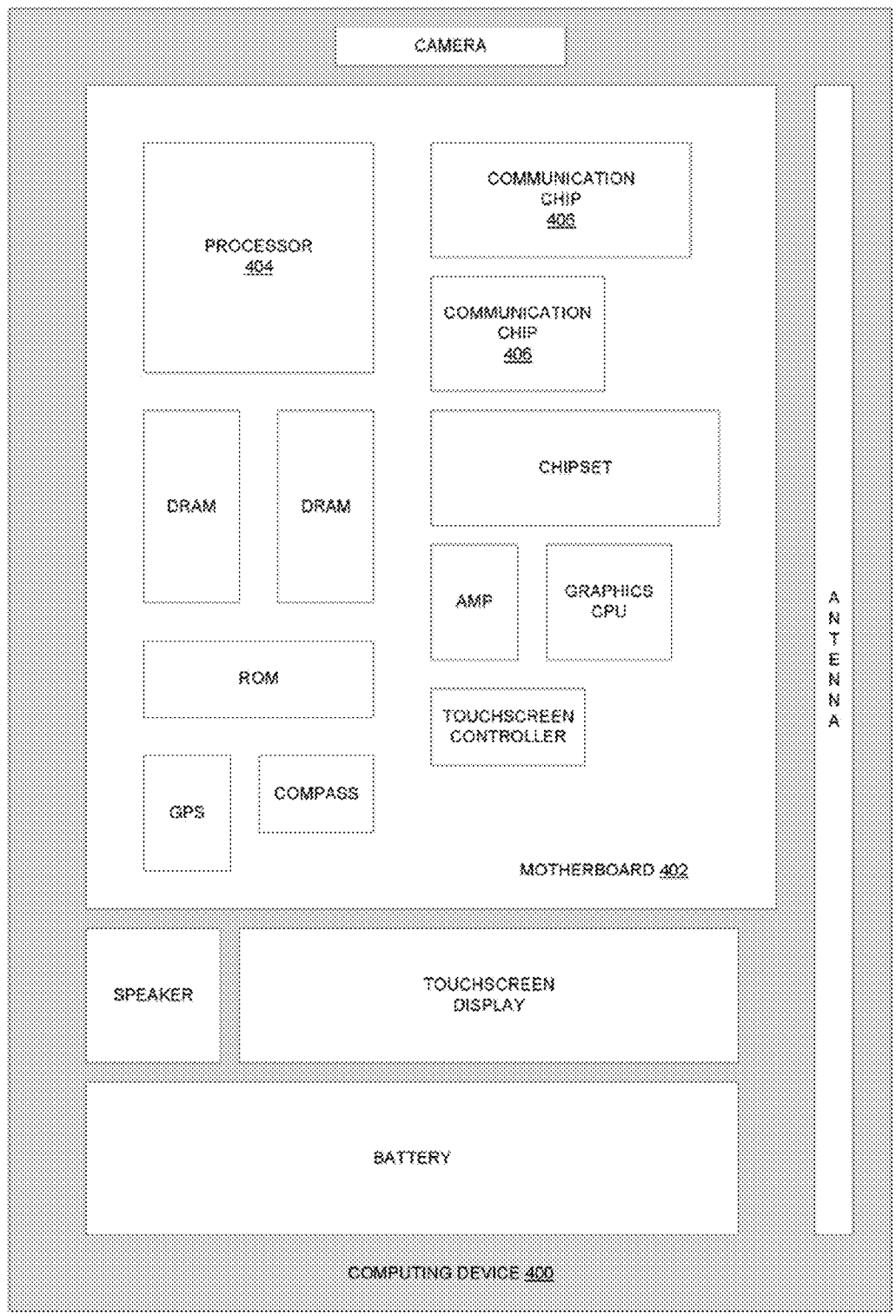
FIG. 4 illustrates a computing device in accordance with one implementation of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices, such as MOS-FET transistors built in accordance with implementations of the invention.

In further implementations, another component housed within the computing device 400 may contain an integrated circuit die that includes one or more devices, such as MOS-FET transistors built in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Thus, semiconductor devices having metallic source and drain regions have been disclosed. In an embodiment, a semiconductor device includes a gate electrode stack disposed above a semiconducting channel region of a substrate. Metallic source and drain regions are disposed above the substrate, on either side of the semiconducting channel region. Each of the metallic source and drain regions has a profile. A first semiconducting out-diffusion region is disposed in the substrate, between the semiconducting channel region and the metallic source region, and conformal with the profile of the metallic source region. A second semiconducting out-diffusion region is disposed in the substrate, between the semiconducting channel region and the metallic drain region, and conformal with the profile of the metallic drain region. In one embodiment, the metallic source and drain regions are each included in a corresponding continuous contact structure disposed in a dielectric layer disposed above the substrate.

What is claimed is:

1. A semiconductor device, comprising:
 a gate electrode stack disposed above a semiconducting channel region of a substrate;
 a pair of insulating sidewall spacers adjacent the gate electrode stack;
 metallic source and drain regions disposed above the substrate, on either side of the semiconducting channel region, each of the metallic source and drain regions having a profile, wherein the metallic source and drain regions are disposed vertically beneath a corresponding one of the pair of insulating sidewall spacers but not vertically beneath the gate electrode stack;
 a first semiconducting out-diffusion region disposed in the substrate, between the semiconducting channel region and the metallic source region, and conformal with the profile of the metallic source region, wherein a portion of the first semiconducting out-diffusion region is disposed vertically beneath and in contact with one of the pair of insulating sidewall spacers and vertically beneath the gate electrode stack; and
 a second semiconducting out-diffusion region disposed in the substrate, between the semiconducting channel region and the metallic drain region, and conformal with the profile of the metallic drain region, wherein a portion of the second semiconducting out-diffusion region is disposed vertically beneath and in contact with another one of the pair of insulating sidewall spacers and vertically beneath the gate electrode stack.

2. The semiconductor device of claim 1, wherein the metallic source and drain regions have rounded profiles, and the first and second semiconducting out-diffusion regions are conformal with the rounded profiles.

3. The semiconductor device of claim 1, wherein the metallic source and drain regions have faceted profiles, and the first and second semiconducting out-diffusion regions are conformal with the faceted profiles.

4. The semiconductor device of claim 1, wherein the metallic source and drain regions are each included in a corresponding continuous contact structure disposed in a dielectric layer disposed above the substrate.

5. The semiconductor device of claim 1, wherein the metallic source and drain regions comprise a conductive material selected from the group consisting of a metal nitride, a metal carbide, a metal silicide, a metal aluminide, hafnium, zirconium, titanium, tantalum, aluminum, ruthenium, palladium, platinum, cobalt, nickel or a conductive metal oxide.

6. The semiconductor device of claim 1, wherein the metallic source and drain regions uniaxially stress the semiconducting channel region.

7. The semiconductor device of claim 1, wherein the semiconductor device is an N-type device, the semiconducting channel region comprises silicon, and the first and second semiconducting out-diffusion regions comprise dopant impurity atoms selected from the group consisting of phosphorous and arsenic.

8. The semiconductor device of claim 7, wherein the metallic source and drain regions comprise a material selected from the group consisting of a metal carbide or a metal aluminide.

9. The semiconductor device of claim 1, wherein the semiconductor device is a P-type device, the semiconducting channel region comprises silicon, and the first and second semiconducting out-diffusion regions comprise boron dopant impurity atoms.

10. The semiconductor device of claim 9, wherein the metallic source and drain regions comprise a material selected from the group consisting of a metal nitride, a metal carbide, or a metal silicide.

11. The semiconductor device of claim 1, wherein the substrate is a bulk substrate, and the semiconducting channel region is continuous with the bulk substrate.

12. The semiconductor device of claim 1, wherein the substrate includes an insulating layer, and the semiconducting channel region is an isolated channel region.

13. The semiconductor device of claim 1, wherein the semiconducting channel region comprises a three-dimensional body, and the gate electrode stack surrounds at least a top surface and a pair of sidewalls of the three-dimensional body.

14. A semiconductor structure, comprising:
an N-type semiconductor device, comprising:
  an N-type gate electrode stack disposed above a first semiconducting channel region of a substrate;
  a first pair of insulating sidewall spacers adjacent the N-type gate electrode stack;
  first metallic source and drain regions disposed above the substrate, on either side of the first semiconducting channel region, each of the first metallic source and drain regions having a first profile, wherein the first metallic source and drain regions are disposed vertically beneath a corresponding one of the first pair of insulating sidewall spacers but not vertically beneath the N-type gate electrode stack; and
  a first pair of semiconducting out-diffusion regions disposed in the substrate, between the first semiconducting channel region and a corresponding one of the first metallic source and drain regions, and conformal with the corresponding first profile, wherein a portion of the first pair of semiconducting out-diffusion regions is disposed vertically beneath and in contact with the first pair of insulating sidewall spacers and vertically beneath the N-type gate electrode stack; and
a P-type semiconductor device, comprising:
  a P-type gate electrode stack disposed above a second semiconducting channel region of the substrate;
  a second pair of insulating sidewall spacers adjacent the P-type gate electrode stack;
  second metallic source and drain regions disposed above the substrate, on either side of the second semiconducting channel region, each of the second metallic source and drain regions having a second profile, wherein the second metallic source and drain regions are disposed vertically beneath a corresponding one of the second pair of insulating sidewall spacers but not vertically beneath the P-type gate electrode stack; and
  a second pair of semiconducting out-diffusion regions disposed in the substrate, between the second semiconducting channel region and a corresponding one of the second metallic source and drain regions, and conformal with the corresponding second profile, wherein a portion of the second pair of semiconducting out-diffusion regions is disposed vertically beneath and in contact with the second pair of insulating sidewall spacers and vertically beneath the P-type gate electrode stack.

15. The semiconductor structure of claim 14, wherein one of the first or second metallic source and drain region pairs have rounded profiles, and the corresponding first or second pairs of semiconducting out-diffusion regions is conformal with the rounded profiles.

16. The semiconductor structure of claim 14, wherein one of the first or second metallic source and drain region pairs have faceted profiles, and the corresponding first or second pairs of semiconducting out-diffusion regions is conformal with the faceted profiles.

17. The semiconductor structure of claim 15, wherein the first or second metallic source and drain region pairs is included in a pair of continuous contact structures disposed in a dielectric layer disposed above the substrate.

18. The semiconductor structure of claim 14, wherein the first metallic source and drain regions uniaxially stress the first semiconducting channel region, and the second metallic source and drain regions uniaxially stress the second semiconducting channel region.

19. The semiconductor structure of claim 14, wherein the first semiconducting channel region comprises silicon, and the first pair of semiconducting out-diffusion regions comprises dopant impurity atoms selected from the group consisting of phosphorous and arsenic, and wherein the second semiconducting channel region comprises silicon, and the second pair of semiconducting out-diffusion regions comprises boron dopant impurity atoms.

20. The semiconductor structure of claim 19, wherein the first metallic source and drain regions comprise a material selected from the group consisting of a metal carbide or a metal aluminide, and wherein the second metallic source and drain regions comprise a material selected from the group consisting of a metal nitride, a metal carbide, or a metal silicide.

21. The semiconductor structure of claim 14, wherein the substrate is a bulk substrate, and the first and second semiconducting channel regions are continuous with the bulk substrate.

22. The semiconductor structure of claim 14, wherein the substrate includes an insulating layer, and the first and second semiconducting channel regions are isolated channel regions.

23. The semiconductor structure of claim 14, wherein the first and second semiconducting channel regions each comprises a three-dimensional body, and the corresponding gate electrode stack surrounds at least a top surface and a pair of sidewalls of the three-dimensional body.

* * * * *